(12) United States Patent
Ikeda

(10) Patent No.: US 6,307,433 B1
(45) Date of Patent: Oct. 23, 2001

(54) PREAMPLIFIER FOR HIGH SPEED OPTICAL FIBER COMMUNICATION SYSTEM

(75) Inventor: Hitoshi Ikeda, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/570,549

(22) Filed: May 12, 2000

(30) Foreign Application Priority Data

Feb. 1, 2000 (JP) .................................................. 12-024091

(51) Int. Cl.[7] .................................. H03F 1/36; H03F 3/08
(52) U.S. Cl. .............................. 330/86; 330/308; 330/110
(58) Field of Search ................................ 330/86, 85, 110, 330/282, 308; 250/214 A, 214 AC

(56) References Cited

U.S. PATENT DOCUMENTS

| | | | |
|---|---|---|---|
| 5,302,911 | * 4/1994 | Miyashita | 330/310 |
| 5,801,588 | * 9/1998 | Nishiyama | 330/308 |
| 5,821,814 | * 10/1998 | Katayama et al. | 330/110 |
| 5,952,887 | * 9/1999 | Katayanagi et al. | 330/110 |
| 6,140,878 | * 10/2000 | Masuta | 330/86 |

FOREIGN PATENT DOCUMENTS 9-232877   9/1997   (JP) .

* cited by examiner

Primary Examiner—Robert Pascal
Assistant Examiner—Khanh Van Nguyen
(74) Attorney, Agent, or Firm—Wenderoth, Lind & Ponack, L.L.P.

(57) ABSTRACT

A trans-impedance type preamplifier for an optical communication system with a high conversion gain and a wide band is provided, in which a preamplifier suppresses obvious peaking and has a flat gain characteristic over a high frequency range and a wide dynamic range. In the trans-impedance type preamplifier, the preamplifier includes an amplifier circuit, a feedback circuit, and a control circuit. The amplifier circuit includes a source grounded input FET for amplifing an electrical signal and a cascade-connected FET to which resistances are connected. Further, FET to which an output signal from the drain of the cascade-connected FET is input, a level shift diode, and an electrical current source FET are included therein. An output terminal is connected to the drain of the electrical current source FET. The feedback circuit has a circuit portion in which the first feedback resistance is connected to input and output terminals of the amplifier circuit and a feedback FET connected to the first feedback resistance in parallel and the second feedback resistance are connected to the feedback FET in series. Further, a capacitor connected to the second feedback resistance in parallel is included therein. An output signal from the control circuit is input to the gate of the feedback FET of the feedback circuit.

3 Claims, 4 Drawing Sheets

PREAMPLIFIER FOR HIGH SPEED OPTICAL FIBER COMMUNICATION SYSTEM

BACKGROUND OF THE INVENTION

1. Field of the Invention

The present invention relates to a preamplifier used in a high speed optical fiber communication system, and more particularly to a trans-impedance type preamplifier in which an electrical current signal is amplified through electrical current-voltage conversion. Still more particularly, the present invention relates to the technology by which various characteristics are improved efficiently, in which a wide band, a wide dynamic range, and high impedance are made possible.

2. Description of Related Art

In a receiver of an optical fiber communication system, a light signal carried through an optical fiber is converted to electrical current by a photo diode as a photoelectric conversion device. This electrical current signal is output as a voltage 6value by a preamplifier's current-voltage conversion. In this preamplifier, characteristics such as low noise, a wide dynamic range, a wide band, and high gain are required.

In order to satisfy such requirements, an amplifier called a trans-impedance type preamplifier is generally used. A typical trans-impedance type preamplifier includes a feedback resistance connected to input and output terminals.

FIG. 1 is a circuit diagram showing the preamplifier for a conventional optical communication system, and a photo diode (PD is used hereinafter) as a photoelectric conversion device in an optical communication receiver. In this circuit, a PD outputs electric current corresponding to the intensity of a received light signal, the preamplifier converts this electric current signal to a voltage signal through impedance conversion, and the signal is then amplified. The following equation is well-known for describing the relationship between input electric current Iin input to the trans-impedance type preamplifier and output voltage Vout output from the trans-impedance type preamplifier when Rf is defined as a resistance value of the feedback resistance:

$$Vout = -Iin \cdot Rf.$$

In accordance with this equation, sufficient sensitivity, namely sufficient output voltage amplitude, can be obtained, by using the larger value of the feedback resistance Rf.

However, if a resistance value Rf is large, the output amplitude is saturated and the output waveform is then distorted, in the case where the amplitude of the electrical current is large. In the trans-impedance type preamplifier, it is one solution method that a small value of an equivalent resistance of the feedback resistance is used, when electrical current of the input signal is large, in order to improve the dynamic range characteristics.

As shown in FIG. 1, a source and a drain of a feedback transistor are connected in parallel to the feedback resistance, and the combined equivalent resistance value of the feedback resistance and the feedback transistor is defined as total feedback resistance of the preamplifier. Further, a control circuit of the drawing consists of a source follower circuit. When input electrical current is small, the feedback transistor is completely closed, a combined feedback resistance value is equal to the complete feedback resistance.

On the other hand, when input electrical current is large, since the control circuit changes gate voltage of the feedback transistor in accordance with the value of input current, the value of the above-described combined feedback resistance, namely, the current-voltage conversion gain can be changed and thus a wide dynamic range can be obtained.

In order to obtain a preamplifier having a high conversion gain of more than 1 KΩ (approximately 60 dbΩ) trans-impedance and a band width of ten or slightly more GHz, it is necessary that the gain-bandwidth product makes the range bigger. At the same time, it is important to utilize a peaking characteristic based on the feedback circuit.

For a frequency lower than several GHz, a phase of an output terminal of an amplifier shown in FIG. 3 is inverted to a phase of an input terminal thereof, and the type of feedback by the feedback resistance is a negative feedback. However, when the frequency is 10 GHz or more, delay of a feedback loop is unavoidable and thus the feedback by the feedback resistance becomes nearly a positive feedback due to the phase delays. That is to say, peaking phenomenon occurs.

Peaking phenomenon is used as a design method to expand band width in a high frequency region, by utilizing a phenomenon in which the closer the negative feedback is to the positive feedback, the more the conversion gain increases.

Here, band-width fw of the amplifier circuit is in general expressed by the following equation:

$$fw = 1/(2\pi Rin \cdot Cin) = A/(2\pi Rf \cdot Cin),$$

where Rin is an input resistance, Cin is an input capacitor (PD's junction capacity, amplifier's input capacity, and floating capacity loaded in practice), and A is a close loop gain of the amplifier circuit.

In a conventional preamplifier as shown in FIG. 1, when input electrical current is large, the equivalent resistance of the feedback resistance Rf is small, and thus the band width grows in accordance with the above-described equation. However, there has been a problem where, in a high conversion gain and wide band circuit using the above-described peaking effect, when large electrical current is input, it has been impossible to make a wide band of a frequency having a wide dynamic range, since output voltage is distorted or oscillated because of the obvious peaking phenomenon.

SUMMARY OF THE INVENTION

The object of the present invention is to provide a preamplifier, in which a trans-impedance type preamplifier for an optical communication system with a high conversion gain and a wide band can suppress obvious peaking when large electric current is input, perform a flat gain characteristic over high frequency regions, and function in a wide dynamic range.

In order to achieve the above-described object, the preamplifier for the optical communication system of the present invention, when the preamplifier is a trans-impedance type preamplifier connected to an output from an acceptance device for converting an input light signal to an electrical signal, includes: an amplifier circuit having a source grounded input FET for amplifying the electrical signal, resistance elements, cascade-connected FETs, an FET to which an output signal from a drain of the cascade-connected FET is input, a level shift diode, and an electric current source FET having an output terminal in a drain of the electric current source FET; a feedback circuit having a first feedback resistance connected to an input terminal and an output terminal of the amplifier circuit, a circuit portion in which a feedback FET connected to the first feedback resistance in parallel and the second feedback resistance are connected in series, and a capacitor connected to the second feedback resistance in parallel; and a control circuit in which an output signal is input to a gate of the feedback FET of the feedback circuit.

Further, the present invention is characterized in that the control circuit includes a source follower circuit having an FET to which a signal from a drain of the cascade-connected FETs of the amplifier circuit is input, a level shift diode, and an electric current source FET; and an output signal from a drain of the electric current source FET is amplified by a source grounded FET, following which the amplified output signal from the drain is input to a gate of the feedback FET of the feedback circuit.

Still further, the present invention is characterized in that the control circuit includes a first source follower circuit having an FET to which a signal from a drain of the cascade-connected FETs of the amplifier circuit is input, a level shift diode, an electric current source FET and a second source follower circuit. Within the electric current source FET and the second source follower circuit, an output signal from a drain of the electric current source FET is amplified by a source grounded FET, receiving an amplified output signal from the drain, and an output signal from the second source follower circuit is input to the gate of the feedback FET of the feedback circuit.

BRIEF DESCRIPTION OF THE DRAWINGS

The present invention will be understood more fully from the detailed description given below, in conjunction with the accompanying drawings.

DETAILED DESCRIPTION OF THE INVENTION

The invention will now be described based on the preferred embodiments. These do not intend to limit the scope of the present invention, but exemplify the invention. All of the features and the combinations thereof described in the embodiments are not necessarily essential to the invention.

In the first and third preferred embodiments, the configuration of a circuit using depletion type GaAs/AlGaAs HEMTs (FET is used hereinafter) is explained, with reference to the illustrative embodiments.

First Preferred Embodiment

Figure 1:
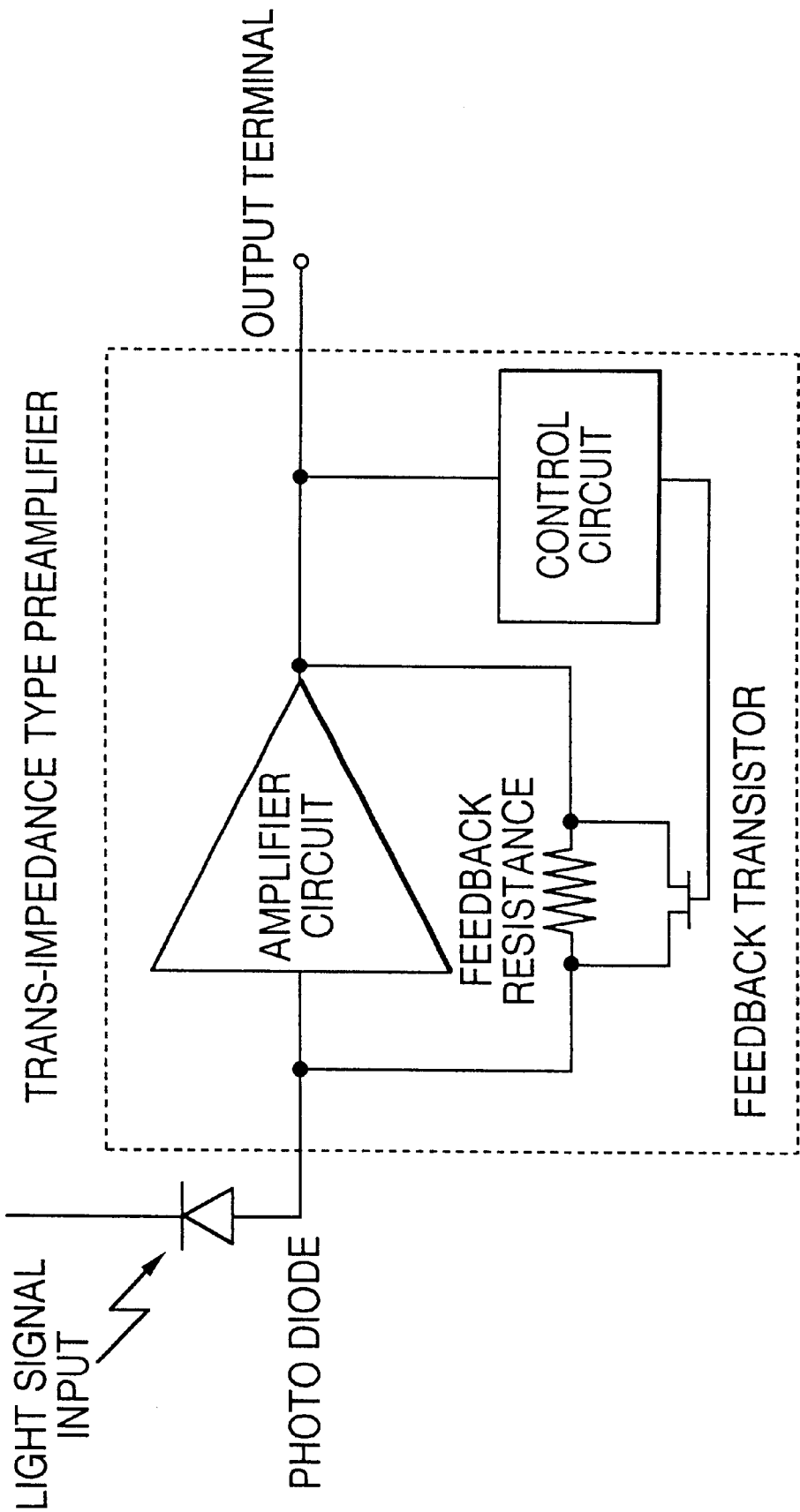
FIG. 1 shows a conventional trans-impedance type preamplifier.
Figure 2:
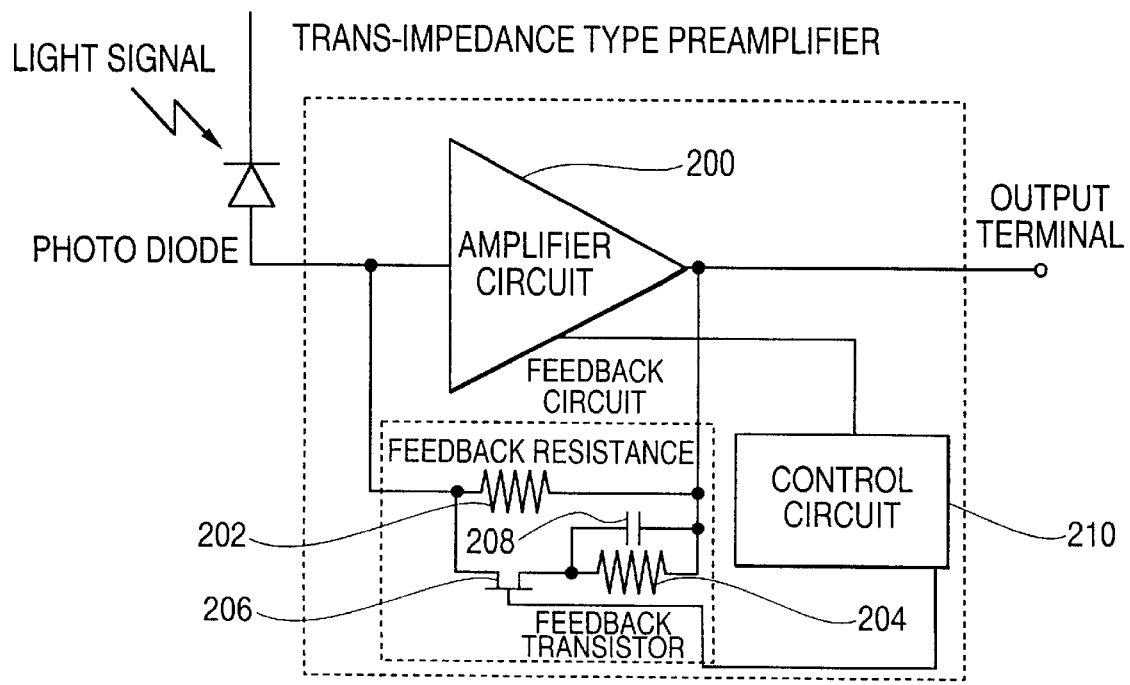
FIG. 2 shows a trans-impedance type preamplifier of the present invention.

As shown in FIG. 2, in accordance with the preferred embodiment, the first feedback resistor 202, which is connected between input and output terminals of an amplifier 200, are provided. Further, parts connected by the feedback FET 206 and the second feedback resistor 204 are connected in parallel to the first feedback resistor 202. Still further, it is characterized that a feedback capacitor 208 is connected in parallel to the second feedback resistor 204.

Figure 3:
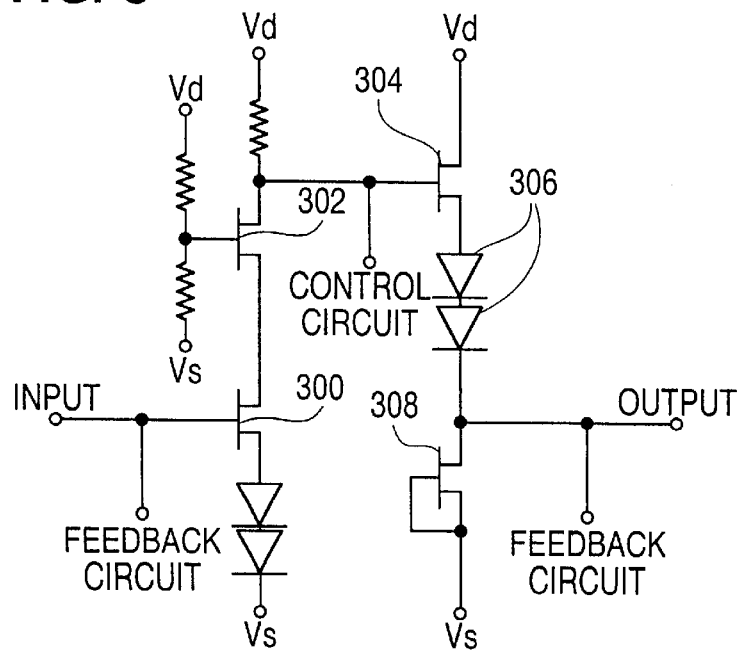
FIG. 3 shows an amplifier circuit of the first preferred embodiment of the present invention.

In accordance with the first preferred embodiment, the capacitance of the feedback capacitor is 0.15 pF. Further, as shown in FIG. 3, an amplifier circuit 200 shown in FIG. 2 includes a source grounded input FET 300, for amplifying a signal and FET 302 cascade-connected to another part of a load, and also has an FET 304 for inputting a drain output signal of the cascade-connected FET 302, level shift diodes 306, and an electric current source 308. A signal to a control circuit 210 references the cascade-connected FET 302. The control circuit 210 consists of a source follower circuit as shown in FIG. 4, including, source follower FET 400, level shift diodes 402 and the electric current source 406.

Figure 4:
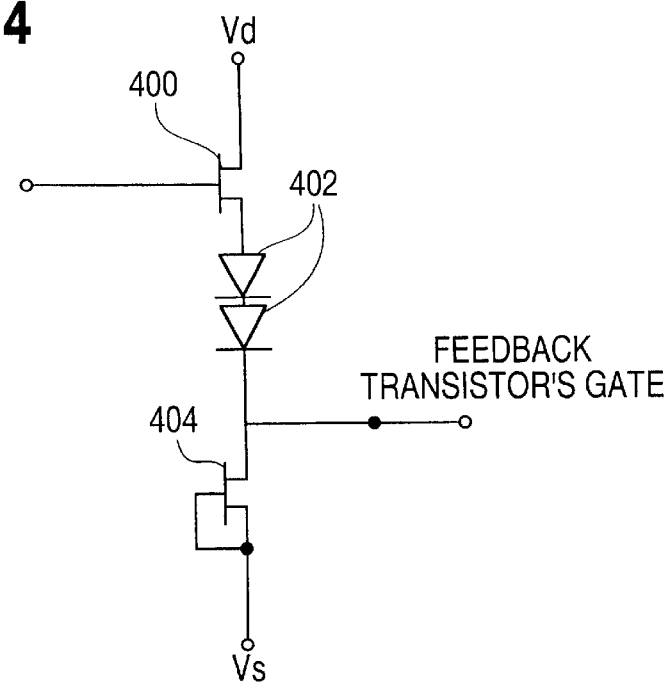
FIG. 4 shows a control circuit of the first preferred embodiment of the present invention.

A preamplifier is driven by connecting Vd to the ground and applying −5 volts (V) to Vs terminal, as shown in FIGS. 3 and 4. The output wave form is not distorted by the input signal's power, within the range of −20 to −1 dBm, and a flat frequency characteristic is obtained, in which the peak in the high frequency region when a large electric current value is input, is suppressed below 1 dBΩ.

As an example for comparison, a preamplifier in which a feedback capacitor was not included was manufactured by way of trial. When the feedback capacitor was not included, however, peaking of more or less 7 dBΩ occurred in the vicinity of a frequency region of 8 GHz at −10 dBm light input. On the other hand, when the capacity of the feedback capacitor is set up as first preferred embodiment, e.g. 0.15 pF, it was observed that when a large input of −2 dBm is made, a relatively wide dynamic range of 18 dB (db) was obtained by returning a high frequency signal causing peaking with a short delay time, that is, essentially with the negative feedback condition.

Second Preferred Embodiment

Figure 5:
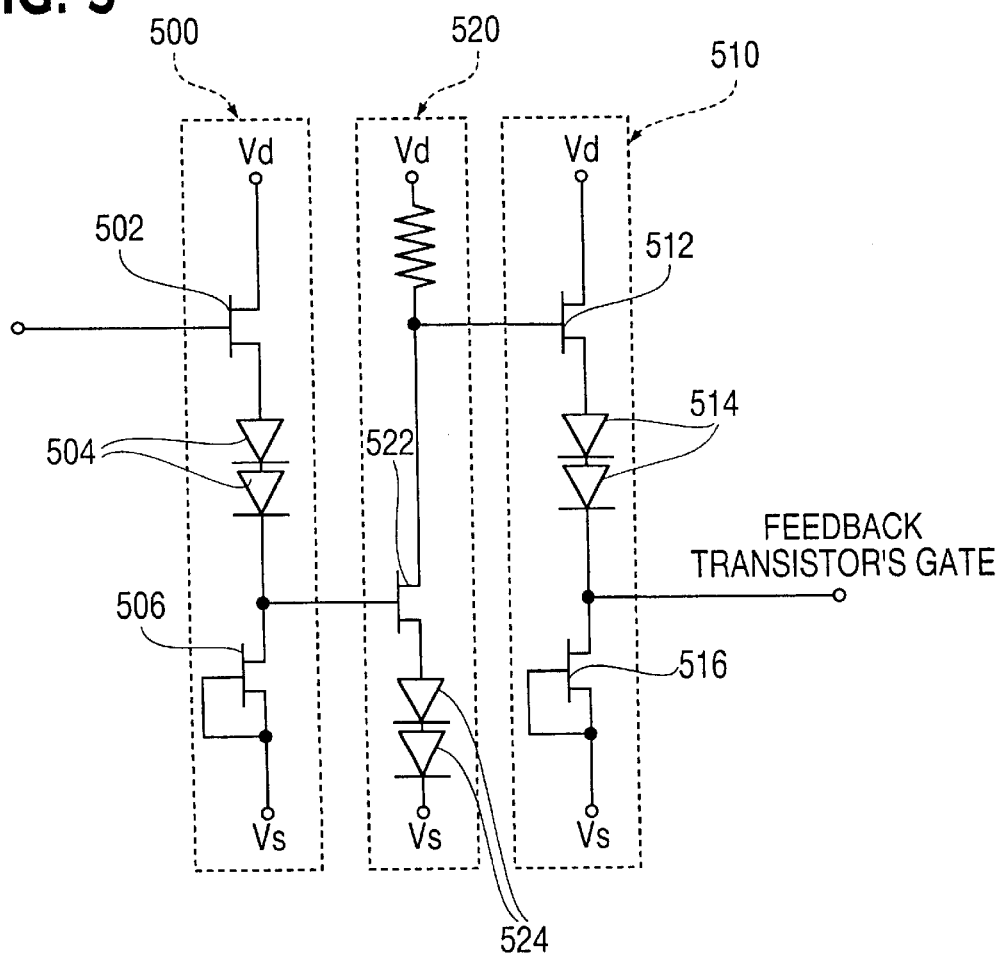
FIG. 5 shows a control circuit of the second preferred embodiment of the present invention.

The second embodiment is the same as the first preferred embodiment except for the control circuit. The control circuit of the second embodiment, as shown in FIG. 5 includes a first source follower stage 500 having the FET 502 for inputting a signal from the drain of cascaded FETs of an amplifier circuit, level shift diodes 504 and the electric current source 506, and a second source follower stage 510 for receiving an amplified drain output amplified by a source grounded FET's stage 520 that includes an FET 522 and diodes 524 connected as shown in FIG. 5. The output from the second source follower stage 510 is input to the gate of the feedback FET of the feed back circuit. The second source follower stage 510 includes an FET 512, level shift diodes 514 and current source 516 connected as shown in FIG. 5.

In FIGS. 3 and 5, the preamplifier of the second preferred embodiment is driven by Vd connected to the ground and Vs to which −5 v is applied. Due to the power of the input signal, a flat frequency characteristic has been obtained, in which a peak is below 1 dBΩ at a high frequency region when a large electric current is input. Additionally, the output waveform is not deformed in the range of −20 dBm to 0 dBm.

In the first preferred embodiment, since the feedback FET 206 and the second feedback resistance 204 are connected in series, the feedback FET 206 cannot be opened sufficiently by an output from a source follower circuit of the control circuit when a large electric current is applied. Therefore, the feedback resistance equivalent to the feedback circuit cannot be minimized adequately.

In the second preferred embodiment, since the signal is amplified in the control circuit, a wider dynamic range can be obtained than the first preferred embodiment. Further, in this preferred embodiment, the feedback capacitor 206 also functions efficiently.

Third Preferred Embodiment

Figure 6:
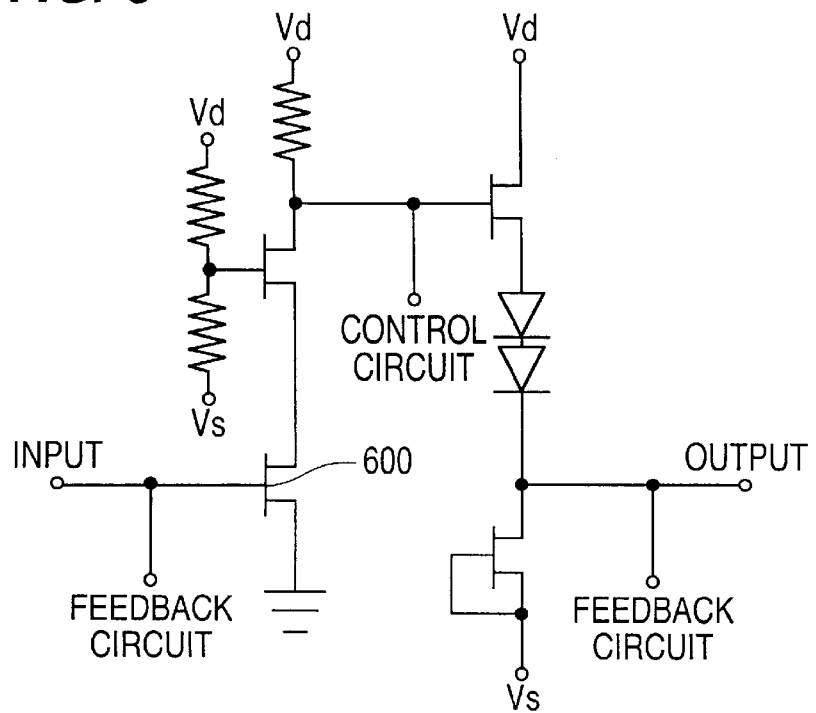
FIG. 6 shows an amplifier circuit of the third preferred embodiment of the present invention.
Figure 7:
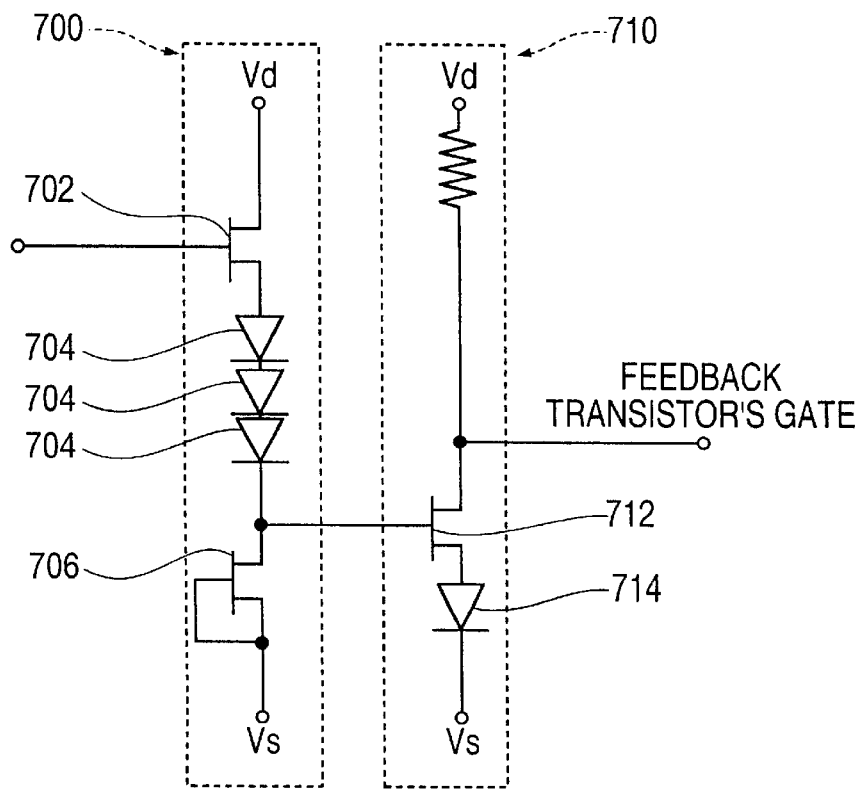
FIG. 7 shows a control circuit of the third preferred embodiment of the present invention.

An amplifier circuit of a third preferred embodiment differs from the first embodiment in that a source of an input FET 600 of the amplifier circuit in the third preferred embodiment is connected to the ground as shown in FIG. 6, and the control circuit, as shown in FIG. 7, includes a source follower stage 700 including an FET 702, three level shift diodes 704, and current source 706 connected as shown, and a source grounded amplifier stage 710 including an FET 712 and diode 714 connected as shown.

In FIGS. 6 and 7, +3.3 V and −2 V are applied to a Vd terminal and a Vs terminal respectively, in order to drive the preamplifier. Due to the power of the input signal, flat frequency characteristics have been obtained, in which a peak is below 1 dBΩ at a high frequency region when large electric current is input. Additionally, the output waveform is not deformed in the range of −20 dBm to 2 dBm.

A single power source, −5 V, is used in the second preferred embodiment, and a two-stage level shift diode 504 is connected to a source of an input FET 502 of the amplifier circuit. 0.8 V per one-stage is applied to the level shift diode 504 as the voltage source. Input bias is then defined as approximately −3.4 V as a design value. In the second preferred embodiment, in order to completely close the feedback FET 206 of the feedback circuit when micro electric current is applied, the output is obtained from the source follower circuit of the control circuit.

In the third preferred embodiment, if a difference between a negative power source and input bias of the amplifier circuit is 2 V and the output from the control circuit is equal to an output from the source grounded amplifier FET 600, the feedback FET can be closed when micro electric current is applied. Using the above-described control circuit, it is difficult for the output signal from the control circuit to be saturated. Therefore, the feedback circuit functions efficiently for large electric current such as 2 dBm, and thus a wide dynamic range, 22 dB, is possible.

What is claimed is:

1. A trans-impedance preamplifier for use in an optical communication system and to be connected to an output from an acceptance device of the optical communication system, wherein the acceptance device is operable to convert an input light signal to an electrical signal, said preamplifier comprising:

an amplifier circuit comprising:
an input terminal,
a source grounded input FET connected to said input terminal for amplifying the electrical signal, said source grounded input FET having a drain,
a cascade-connected FET having a source connected to said drain of said source grounded input FET, said cascade-connected FET having a drain,
a further FET connect to said drain of said cascade-connected FET such that an output signal from said drain of said cascade-connected FET is input into said further FET, said further FET having a source,
a level shift diode connected to said source of said further FET,
an electric current source FET having a drain connected to said level shift diode, and
an output terminal connected to said drain of said electric current source FET;

a feedback circuit comprising:
a first feedback resistor connected to said input and output terminals of said amplifier circuit, and
a circuit portion connected in parallel to said first feedback resistor, said circuit portion comprising a feedback FET and a second feedback resistor connected together in series, and a capacitor connected to said second feedback resistor in parallel, said feedback FET having a gate; and a control circuit connected to said gate of said feedback FET of said feedback circuit such that an output signal of said control circuit is input into said gate of said feedback FET of said feedback circuit.

2. A trans-impedance preamplifier according to claim 1, wherein said control circuit comprises:

a source follower circuit comprising:
an input FET connect to said drain of said cascade-connected FET of said amplifier circuit such that a signal from said drain of said cascade-connected FET in input to said input FET,
a level shift diode connected to said input FET, and
a further electric current source FET connected to said level shift diode, said further electric current source ET having a drain; and a further source grounded FET connect to said drain of said further electric current source FET of said source follower circuit and operable to amplify an output from said drain of said further electric current source FET of said source follower circuit, and said further source grounded FET includes a drain connected to said gate of said feedback FET of said feedback circuit.

3. A trans-impedance preamplifier according to claim 1, wherein said control circuit comprises:

a first source follower circuit comprising:
an input FET connect to said drain of said cascade-connected FET of said amplifier circuit such that a signal from said drain of said cascade-connected FET in input to said input FET,
a level shift diode connected to said input FET, and
a further electric current source FET connected to said level shift diode, said further electric current source FET having a drain;

a further source grounded FET connect to said drain of said further electric current source FET of said source follower circuit and operable to amplify an output from said drain of said further electric current source FET of said first source follower circuit, and said further source grounded FET including a drain; and a second source follower circuit comprising:
a second-source-follower input FET connect to said drain of said further source grounded FET such that a signal from said drain of said further source grounded FET in input to said second-source-follower input FET,
a second-source-followed level shift diode connected to said second-source-follower input FET,
a second-source-follower electric current source FET connected to said second-source-follower level shift diode, said second-source-follower electric current source FET having a drain connected to said gate of said feedback FET of said feedback circuit.

* * * * *